United States Patent
Kim

(10) Patent No.: US 10,410,726 B2
(45) Date of Patent: Sep. 10, 2019

(54) SEMICONDUCTOR MEMORY DEVICE AND METHOD OF OPERATING THE SAME

(71) Applicant: SK hynix Inc., Icheon-si, Gyeonggi-do (KR)

(72) Inventor: Hae Soo Kim, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 11 days.

(21) Appl. No.: 15/648,681

(22) Filed: Jul. 13, 2017

(65) Prior Publication Data
US 2018/0190358 A1 Jul. 5, 2018

(30) Foreign Application Priority Data
Dec. 30, 2016 (KR) .................... 10-2016-0183392

(51) Int. Cl.
*G11C 16/16* (2006.01)
*G11C 16/08* (2006.01)
*G11C 16/34* (2006.01)
*G11C 16/04* (2006.01)

(52) U.S. Cl.
CPC .............. *G11C 16/16* (2013.01); *G11C 16/08* (2013.01); *G11C 16/349* (2013.01); *G11C 16/0483* (2013.01)

(58) Field of Classification Search
CPC ... G11C 16/16; G11C 16/349; G11C 16/0483; G11C 16/08
See application file for complete search history.

(56) References Cited

U.S. PATENT DOCUMENTS

| | | | |
|---|---|---|---|
| 2003/0035322 A1* | 2/2003 | Wong ..................... | G11C 5/025 365/185.33 |
| 2012/0051136 A1* | 3/2012 | Kang ..................... | G11C 16/16 365/185.17 |
| 2012/0051143 A1* | 3/2012 | Yoon .................. | G11C 16/0483 365/185.22 |
| 2012/0195125 A1 | 8/2012 | Choe et al. | |
| 2013/0007353 A1* | 1/2013 | Shim ...................... | G11C 16/10 711/103 |
| 2015/0170749 A1* | 6/2015 | Park ....................... | G11C 16/14 365/185.05 |
| 2017/0076803 A1* | 3/2017 | Lee ......................... | G11C 16/14 |

FOREIGN PATENT DOCUMENTS

KR 1020150091893 A 8/2015

* cited by examiner

*Primary Examiner* — Khamdan N. Alrobaie
(74) *Attorney, Agent, or Firm* — William Park & Associates Ltd.

(57) ABSTRACT

There may be provided a semiconductor memory device including a memory cell array, an erase count storage unit, and a control logic. The memory cell array may include a plurality of memory blocks. Each of the plurality of memory blocks may include a plurality of cell strings. The erase count storage unit may be configured to store an erase count value for each of the plurality of memory blocks. During an erase operation of a memory block, the erase operation may be performed based on the erase count value.

20 Claims, 11 Drawing Sheets

SEMICONDUCTOR MEMORY DEVICE AND METHOD OF OPERATING THE SAME

CROSS-REFERENCE TO RELATED APPLICATION

The present application claims priority under 35 U.S.C. § 119(a) to Korean patent application number 10-2016-0183392 filed on Dec. 30, 2016 in the Korean Intellectual Property Office, the entire disclosure of which is incorporated herein by reference.

BACKGROUND

1. Technical Field

An embodiment of the present disclosure may generally relate to an electronic device, and more particularly, to a semiconductor memory device and a method of operating the same.

2. Related Art

Semiconductor memory devices are implemented by using semiconductors such as silicon (Si), germanium (Ge), gallium arsenide (GaAs), and indium phosphide (InP). The semiconductor memory devices are divided into volatile memory devices and non-volatile memory devices.

Stored data is erased from the volatile memory devices when a power supply is interrupted. The volatile memory devices include a static random access memory (SRAM), a dynamic RAM (DRAM), and a synchronous DRAM (SDRAM). The non-volatile memory devices keep stored data although a power supply is interrupted. The non-volatile memory devices include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), and a ferroelectric RAM (FRAM). Flash memories are divided into NOR type flash memories and NAND type flash memories.

SUMMARY

A semiconductor memory device according to an embodiment of the present disclosure may include a semiconductor memory device including a memory cell array, an erase count storage unit, and a control logic. The memory cell array may include a plurality of memory blocks. Each of the plurality of memory blocks may include a plurality of cell strings. The erase count storage unit may be configured to store an erase count value for each of the plurality of memory blocks. During an erase operation of a memory block, the control logic may be configured to control the semiconductor memory device to perform the erase operation based on the erase count value of the memory block to be erased.

A semiconductor memory device according to an embodiment of the present disclosure may include a memory cell array and a peripheral circuit unit. The memory cell array may include a plurality of cell strings. Each of the plurality of cell strings may include a plurality of source select transistors, a plurality of memory cells, and a plurality of drain select transistors that are coupled between a source line and a bit line. The peripheral circuit unit may be configured to apply an erase pre-voltage and an erase voltage to a cell string to be erased during an erase operation and to erase data stored in the plurality of memory cells included in the selected cell string. The peripheral circuit unit may be configured to determine at least one select transistor to which an erase operation voltage is to be applied based on an erase count value that is the number of erase operations performed on the cell string. While a pre-erase voltage is applied to a source line of the selected cell string, the erase operation voltage may be applied to the determined at least one select transistor.

In a method of operating a semiconductor memory device according to an embodiment of the present disclosure, an erase command for a memory block including a plurality of cell strings each including a plurality of source select transistors, a plurality of memory cells, and a plurality of drain select transistors that are coupled between a source line and a bit line is received. An erase count value for the memory block on which the erase command is to be performed may be referred to. Select transistors to be driven during an erase operation may be determined among the plurality of source select transistors and the plurality of drain select transistors based on the referred erase count value. An erase operation may be performed on the memory block on which the erase command is to be performed by using the determined select transistors.

DETAILED DESCRIPTION

Figure 1:
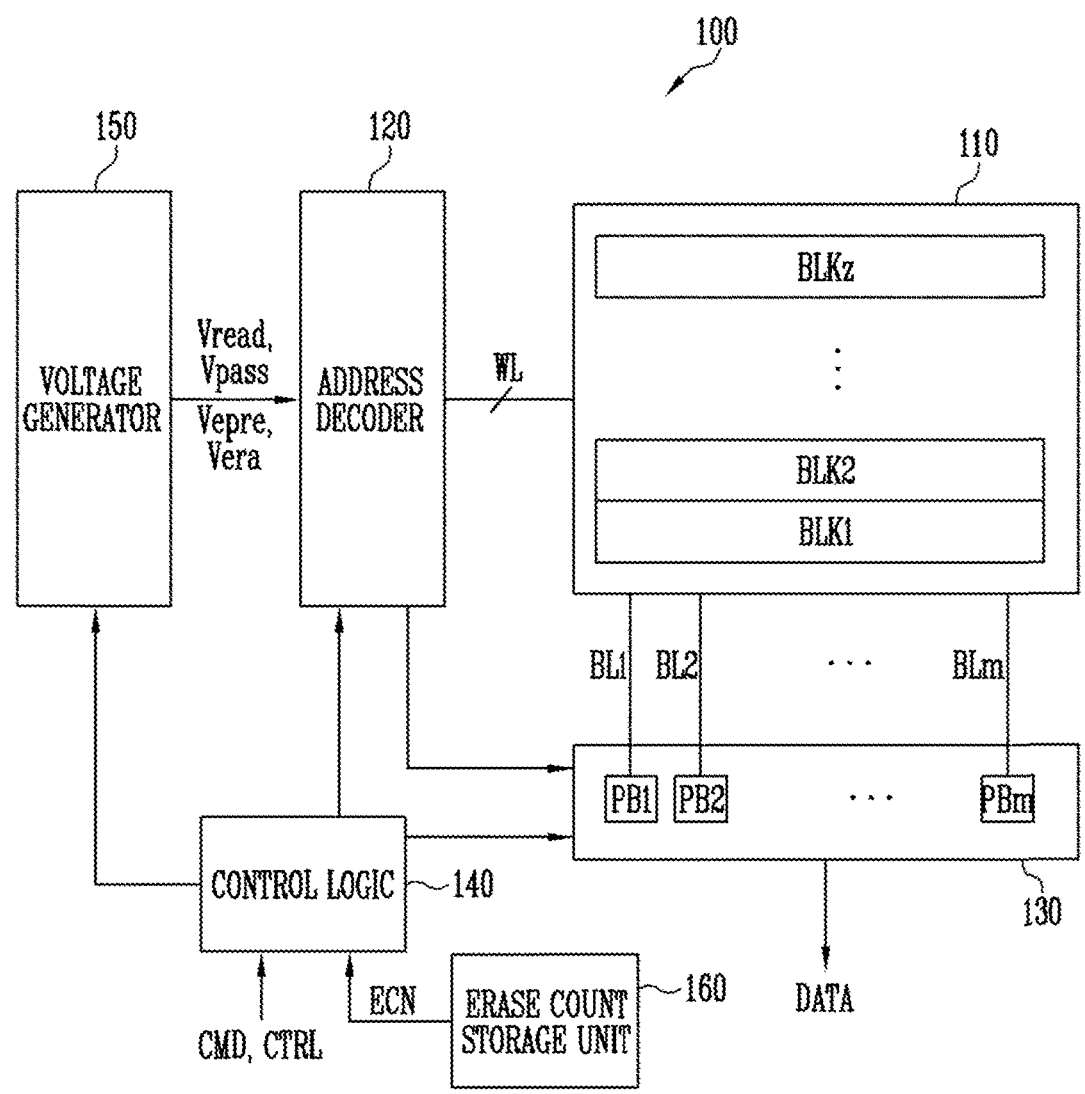
FIG. 1 is a block diagram illustrating a semiconductor memory device according to an embodiment of the present disclosure.

Advantages and features of the present disclosure, and implementation methods thereof will be clarified through the following embodiments described with reference to the accompanying drawings. The present disclosure may, however, be embodied in different forms and should not be construed as limited to the embodiments set forth herein.

Throughout this specification and the claims that follow, when it is described that an element is "connected" to another element, the element may be "directly connected" to the other element or "indirectly connected" to the other element with another element interposed. When it is described that an element "includes" another element, it does not mean to exclude the possibility that other elements may exist or may be added and means other elements may be further included.

Hereinafter, embodiments of the present disclosure are described with reference to the accompanying drawings. Like reference numerals refer to like elements throughout. Description of well-known functions and configurations that may blur the gist of the present disclosure will not be given. In the drawing figures, dimensions may be exaggerated for clarity of illustration. It will be understood that when an element is referred to as being "between" two elements, it can be the only element between the two elements, or one or more intervening elements may also be present.

Examples of embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will full convey the scope of the examples of embodiments to those skilled in the art An embodiment of the present disclosure may relate to a semiconductor memory device capable of preventing reliability thereof from deteriorating as an erase operation is repeated.

An embodiment of the present disclosure may relate to a method of operating a semiconductor memory device, in which it may be possible to prevent reliability of the semiconductor memory device from deteriorating as an erase operation is repeated.

According to an embodiment of the present disclosure, it may be possible to provide a semiconductor memory device capable of preventing reliability thereof from deteriorating as an erase operation is repeated.

According to an embodiment of the present disclosure, it may be possible to provide a method of operating a semiconductor memory device, in which it may be possible to prevent reliability of the semiconductor memory device from deteriorating as an erase operation is repeated.

FIG. 1 is a block diagram illustrating a semiconductor memory device 100 according to an embodiment of the present disclosure.

Referring to FIG. 1, the semiconductor memory device 100 includes a memory cell array 110, an address decoder 120, a read and write circuit 130, a control logic 140, a voltage generator 150, and an erase count storage unit 160. The address decoder 120, the read and write circuit 130, the control logic 140, the voltage generator 150, and the erase count storage unit 160 excluding the memory cell array 110 operate as a peripheral circuit unit for driving the memory cell array 110.

The memory cell array 110 includes a plurality of memory blocks BLK1 through BLKz. The plurality of memory blocks BLK1 through BLKz are connected to the address decoder 120 through word lines WL. The plurality of memory blocks BLK1 through BLKz are connected to the read and write circuit 130 through bit lines BL1 through BLm. Each of the plurality of memory blocks BLK1 through BLKz includes a plurality of memory cells. For example, each of the plurality of memory blocks BLK1 through BLKz includes a plurality of cell strings (not illustrated) and each of the cell strings may include the plurality of memory cells. The cell string will be described with reference to FIGS. 3 and 4.

According to an embodiment, the plurality of memory cells are vertical channel structured non-volatile memory cells. The memory cell array 110 may be two-dimensional. According to an embodiment, the memory cell array 110 may be three-dimensional.

Each of the plurality of memory cells included in the memory cell array 110 may store at least one bit data. According to an embodiment, each of the plurality of memory cells included in the memory cell array 110 may be a single-level cell (SLC) that stores one bit data. According to an embodiment, each of the plurality of memory cells included in the memory cell array 110 may be a multi-level cell (MLC) that stores two-bit data. According to an embodiment, each of the plurality of memory cells included in the memory cell array 110 may be a triple-level cell that stores three-bit data. According to an embodiment, each of the plurality of memory cells included in the memory cell array 110 may be a quad-level cell that stores four-bit data. According to an embodiment, the memory cell array 110 may include a plurality of memory cells each of which stores data of more than or equal to five bits. The memory cell array 110 and the memory blocks BLK1 through BLKz included therein will be described with reference to FIGS. 2 through 4.

The address decoder 120 is connected to the memory cell array 110 through row lines. Referring to FIG. 1, only the word lines WL are illustrated. However, the row lines include drain selecting lines, source selecting lines, and a common source line as well as the word lines WL. On the other hand, according to an embodiment, the row lines may further include a pipe select line.

The address decoder 120 is configured to drive the row lines in response to control of the control logic 140. The address decoder 120 receives addresses through an input and output buffer (not illustrated) in the semiconductor memory device 100.

The address decoder 120 is configured to decode a block address among the received addresses. The address decoder 120 selects at least one memory block in accordance with the decoded block address. In addition, the address decoder 120 applies a read voltage Vread generated by the voltage generator 150 to a selected word line in the memory block selected when the read voltage Vread is applied and applies a pass voltage Vpass to remaining non-selected word lines during a read operation. In addition, the address decoder 120 applies a verification voltage generated by the voltage generator 150 to a selected word line in the selected memory block and applies a pass voltage Vpass to remaining non-selected word lines during a program verification operation.

The address decoder 120 is configured to decode a column address among the received addresses. The address decoder 120 transmits the decoded column address to the read and write circuit 130.

The semiconductor memory device 100 performs read and program operations in units of pages. Addresses received when the read and program operations are requested include a block address, a row address, and a column addresses. The address decoder 120 selects one memory block and one word line in accordance with the block address and the row address. The column address is decoded by the address decoder 120 and is provided to the read and write circuit 130.

An erase operation of the semiconductor memory device 100 is performed in units of memory blocks. That is, during the erase operation, the addresses ADDR include the block address. The address decoder 120 is configured to decode the block address. The address decoder 120 selects at least one memory block among the memory blocks BLK1 through BLKz in accordance with the block address decoded when a pre-erase voltage Vepre and an erase voltage Vera are applied to the channel of the memory cells of the memory cell array 110. The row lines connected to the selected memory block are controlled so that data of the memory cells included in the selected memory block may be erased.

The address decoder 120 may include a block decoder, a row decoder, a column decoder, and an address buffer.

The read and write circuit 130 includes a plurality of page buffers PB1 through PBm. The read and write circuit 130 may operate as a read circuit during the read operation of the memory cell array 110 and may operate as a write circuit during a write operation of the memory cell array 110. The plurality of page buffers PB1 through PBm are connected to the memory cell array 110 through the bit lines BL1 through BLm. The read and write circuit 130 operates in response to the control of the control logic 140. In order to sense threshold voltages of memory cells during a read operation and a program verify operation, the plurality of page buffers PB1 through PBm continuously supply a sensing current to the bit lines connected to the memory cells, sense that an amount of flowing current changes in accordance with a program state of a corresponding memory cell through a sensing node, and latch the sensed change in the amount of current as sensing data. The read and write circuit 130 operates in response to page buffer control signals output from the control logic 140.

The read and write circuit 130 senses the data of the memory cells during the read operation, temporarily stores the read data, and outputs the data DATA to the input and output buffer (not illustrated) of the semiconductor memory device 100. According to an example of an embodiment, the read and write circuit 130 may include a column select circuit other than the page buffers (or page registers).

The control logic 140 is connected to the address decoder 120, the read and write circuit 130, and the voltage generator 150. The control logic 140 receives a command CMD and a control signal CTRL through the input and output buffer (not illustrated) of the semiconductor memory device 100. The control logic 140 is configured to control an overall operation of the semiconductor memory device 100 in response to the control signal CTRL. In addition, the control logic 140 outputs a control signal for controlling sensing node precharge potential levels of the plurality of page buffers PB1 through PBm. The control logic 140 may control the read and write circuit 130 to perform the read operation of the memory cell array 110.

The voltage generator 150 is configured to generate a plurality of operation voltages by using an external voltage supplied to the semiconductor memory device 100. The voltage generator 150 operates in response to the control of the control logic 140. According to an embodiment, the voltage generator 150 may include a circuit for regulating the external voltage and generating a power source voltage. For example, the voltage generator 150 includes a plurality of pumping capacitors and may generate the plurality of operation voltages by selectively activating the plurality of pumping capacitors. The plurality of operation voltages may include the read voltage Vread, the pass voltage Vpass, the pre-erase voltage Vepre, and the erase voltage Vera. During the erase operation, the pre-erase voltage Vepre and the erase voltage Vera among the operation voltages are applied to the common source line of the memory cell array 110 and are transmitted to a channel of memory cells of a selected memory block. On the other hand, an erase operation voltage may be applied to some of select transistors (source select transistors and drain select transistors) of the selected memory block. On the other hand, while the erase operation voltage is applied to some of the select transistors, the other select transistors that are not selected may be floated. For example, the erase operation voltage may be 0V. An erase operation of the semiconductor memory device according to the embodiment of the present disclosure will be described with reference to FIGS. 7 and 8.

Among the plurality of voltages, the erase operation voltage may be applied to drain select lines and source select lines through the address decoder 120. In addition, during the read operation of the semiconductor memory device 100, the voltage generator 150 transmits the read voltage Vread and the pass voltage Vpass to the memory cell array 110 in response to a voltage generator control signal output from the control logic 140.

The erase count storage unit 160 stores an erase count value ECN for each of the memory blocks BLK1 through BLKz included in the memory cell array 110. The erase count value ECN represents how many times the erase operation is performed for a corresponding memory block. Therefore, it is noted that, as the erase count value ECN is larger, a program-erase cycle is repeated for the corresponding memory block a larger number of times and, as the erase count value ECN is smaller, the program-erase cycle is repeated for the corresponding memory block a smaller number of times. The control logic 140 of the semiconductor memory device 100 according to an embodiment of the present disclosure receives the erase count value ECN of a memory block to be erased from the erase count storage unit 160 during the erase operation performed on the memory block. The control logic 140 controls the address decoder and the voltage generator to perform the erase operation based on the erase count value ENC. For example, the control logic 140 may determine transistors to which the erase operation voltage is to be applied in the pre-erase operation among the plurality of source select transistors and the plurality of drain select transistors that are included in the memory strings in the memory block to be erased based on the erase count value ECN. A method of the control logic 140 determining the transistors to which the erase operation voltage is to be applied based on the erase count value ECN will be described later with reference to FIGS. 4 and 6.

Referring to FIG. 1, the erase count storage unit 160 is illustrated as being separate from the control logic 140. However, according to an embodiment, the erase count storage unit 160 may be included in the control logic 140 or may be integrated with the control logic 140.

Figure 2:
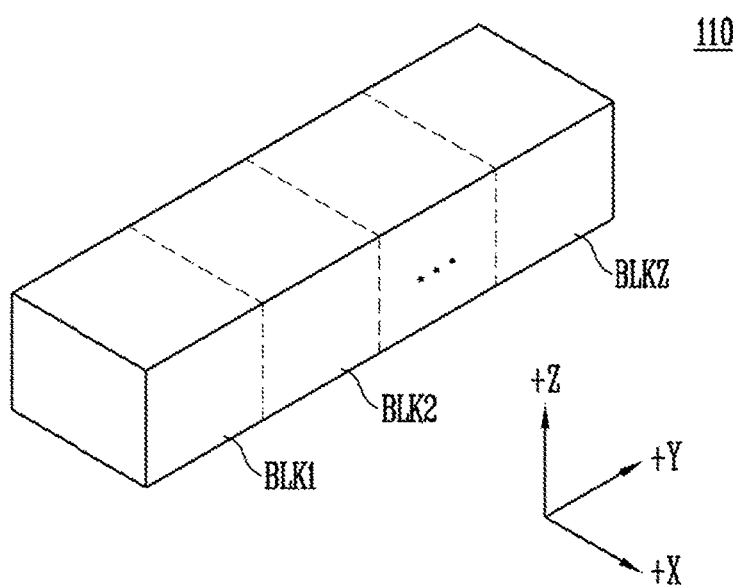
FIG. 2 is a block diagram illustrating an embodiment of the memory cell array 110 of FIG. 1.

FIG. 2 is a block diagram illustrating an embodiment of the memory cell array 110 of FIG. 1.

Referring to FIG. 2, the memory cell array 110 includes the plurality of memory blocks BLK1 through BLKz. Each memory block may have a three-dimensional structure. Each memory block may include a plurality of memory cells stacked on a substrate. The plurality of memory cells may be arranged in a +X direction, a +Y direction, and a +Z direction. A structure of each memory block will be described with reference to FIGS. 3 and 4.

Figure 3:
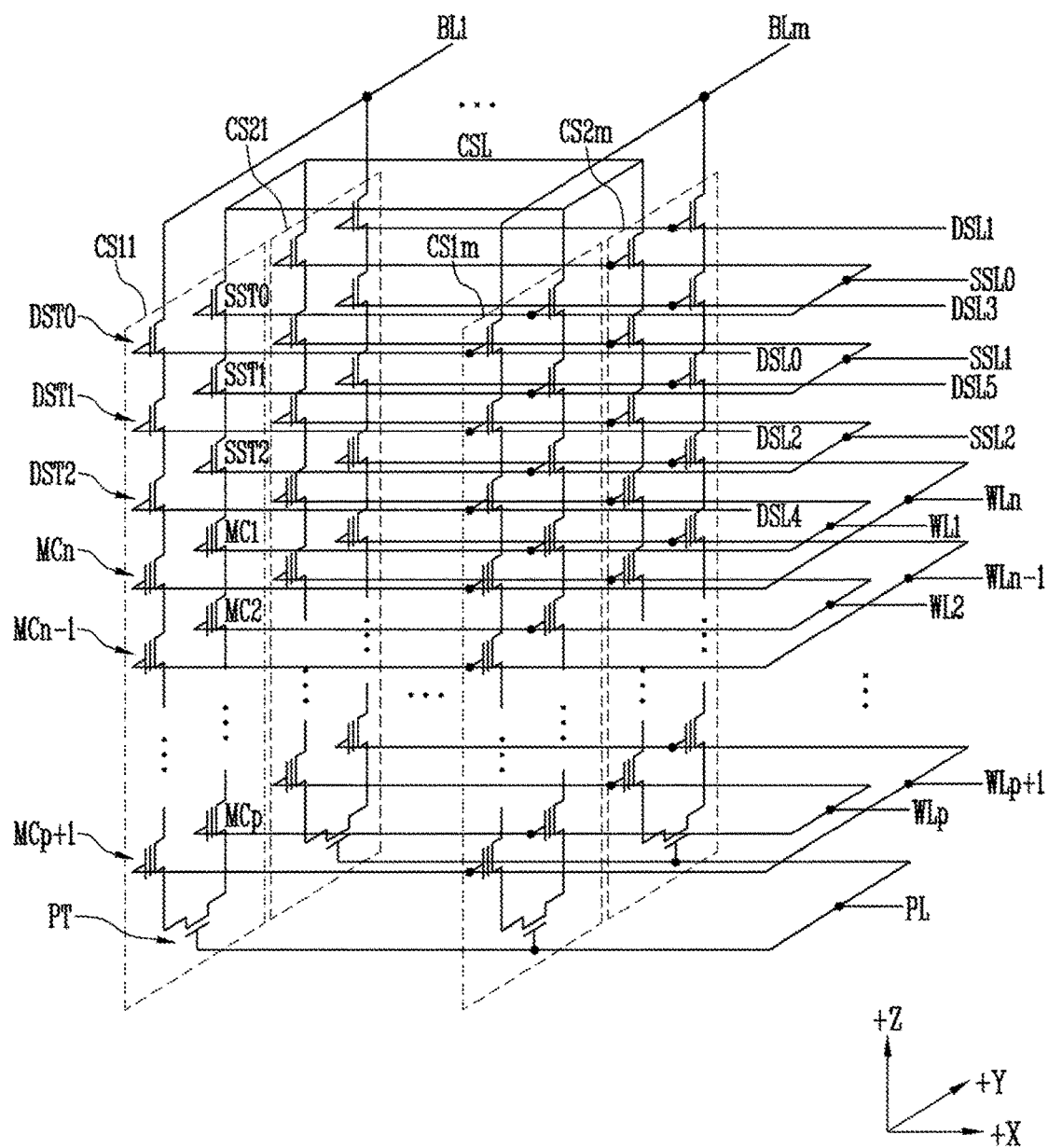
FIG. 3 is a circuit diagram illustrating an embodiment of one of the memory blocks BLK1 through BLKz of FIG. 2.

FIG. 3 is a circuit diagram illustrating an embodiment of one of the memory blocks BLK1 through BLKz of FIG. 2.

Referring to FIG. 3, the memory block BLK1 includes a plurality of cell strings CS11 through CS1$m$ and CS21 through CS2m. Each of the plurality of cell strings CS11 through CS1m and CS21 through CS2m extends in the +Z direction. Each of the plurality of cell strings CS11 through CS1m and CS21 through CS2m includes a plurality of source select transistors SST0 through SST2, first through nth memory cells MC1 through MCn, and a plurality of drain select transistors DST0 through DST2 that are stacked in the +Z direction.

The source select transistor SST0 arranged in the outermost part among the plurality of source select transistors SST0 through SST2 of each cell string is connected to the common source line CSL and the remaining source select transistors SST1 and SST2 are connected between the source select transistor SST0 and the first memory cell MC1. The plurality of source select transistors SST0 through SST2 are respectively connected to a plurality of source select lines SSL0 through SSL2.

A gate of the first memory cell MC1 of each cell string is connected to a first word line WL1. A gate of a second memory cell MC2 of each cell string is connected to a second word line WL2. A gate of a third memory cell MC3 of each cell string is connected to a third word line WL3. A gate of a fourth memory cell MC4 of each cell string is connected to a fourth word line WL4.

A gate of the nth memory cell MCn of each cell string is connected to an nth word line WLn. In addition, a pipe transistor PT is arranged between a pth memory cell MCp and a (p+1)th memory cell MCp+1 and a gate of the pipe transistor PT is connected to a pipe line PL.

Among the plurality of drain select transistors DST0 through DST2 of each cell string, the drain select transistor DST0 arranged in the outermost part is connected to the bit line (for example, BL1) and the remaining drain select transistors DST1 and DST2 are connected between the drain select transistor DST0 and the nth memory cell MCn. The plurality of drain select transistors DST0 through DST2 are respectively connected to a plurality of drain select lines DSL0 through DSL2.

According to the embodiments of FIG. 3, it is illustrated that the three source select transistors SST0 through SST2 and the three drain select transistors DST0 through DST2 are arranged. However, the semiconductor memory devices according to the present disclosure are not limited thereto. At least two source select transistors and at least two drain select transistors, that is, one outermost drain select transistor and at least one remaining drain select transistor having one outermost source select transistor adjacent to the common source line and at least one remaining source select transistor and adjacent to a bit line may be arranged. That is, two or more source select transistors and two or more drain select transistors may be included in one cell string.

The drains elect transistor DST0 of cell strings arranged in the same column, that is, in the +Y direction is connected to the same bit line. The drain select transistor DST0 included in the cell strings CS11 and CS21 is connected to the first bit line BL1. The drain select transistor DST0 included in the cell strings CS1m through CS2m is connected to the mth bit line BLm.

According to an embodiment, although not illustrated in FIG. 3, at least one dummy memory cell is further provided between the drain select transistor DST2 and the first through nth memory cells MC1 through MCn and at least one dummy memory cell may be further provided between the source select transistor SST2 and the first through nth memory cells MC1 through MCn. A dummy memory cell may be arranged between memory cells or to be adjacent to the memory cells for various purposes.

Figure 4:
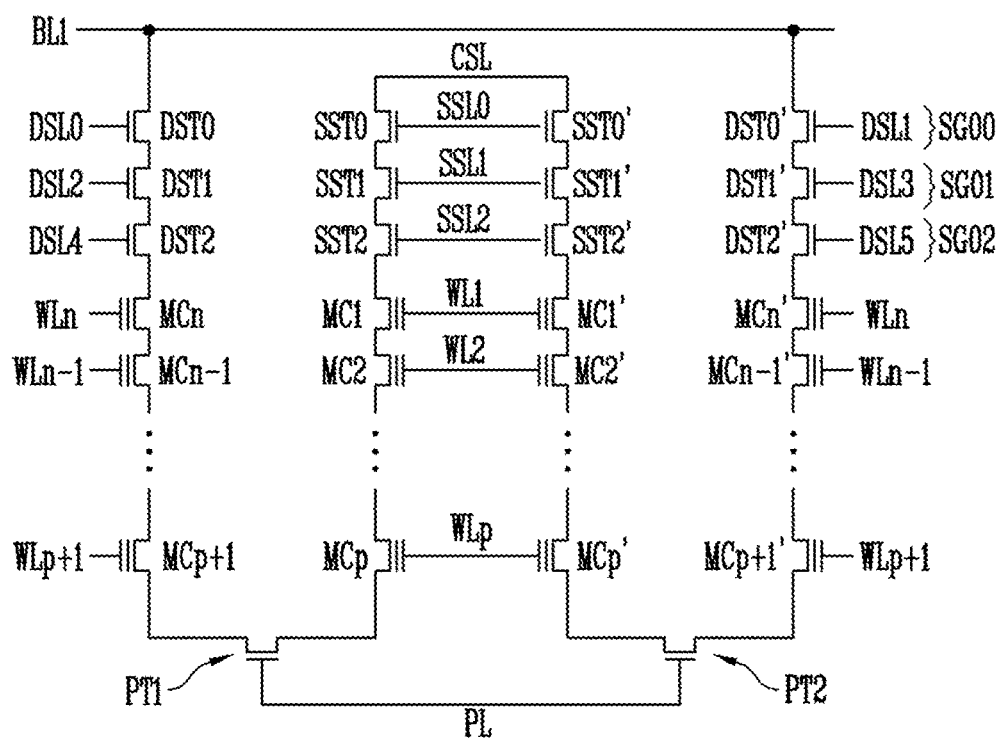
FIG. 4 is a circuit diagram illustrating, for example, two cell strings CS11 and CS21 among cell strings included in the memory block BLK1 of FIG. 3.

FIG. 4 is a circuit diagram, for example, illustrating two cell strings CS11 and CS21 among cell strings included in the memory block BLK1 of FIG. 3. The cell string CS11 includes the source select transistors SST0, SST1, and SST2, the memory cells MC1, MC2, . . . , and MCp, the pipe transistor PT1, the memory cells MCp+1, . . . , MCn−1, and MCn, and the drain select transistors DST2, DST1, and DST0 that are sequentially connected between the common source line CSL and the bit line BL1. In addition, the cell string CS21 includes source select transistors SST0', SST1', and SST2', memory cells MC1', MC2', . . . , and MCp', a pipe transistor PT2, memory cells MCp+1', . . . , MCn−1', and MCn', and drain select transistors DST2', DST1', and DST0' that are sequentially connected between the common source line CSL and the bit line BL1.

In the semiconductor memory device 100 according to an embodiment of the present disclosure, during the erase operation performed on the memory block, the control logic 140 receives the erase count value ECN of the memory block to be erased from the erase count storage unit 160. The control logic 140 may determine transistors to which the erase operation voltage is to be applied in the pre-erase operation among the plurality of source select transistors SST0, SST1, SST2, SST0', SST1', and SST2' and the plurality of drain select transistors DST0, DST1, DST2, DST0', DST1', and DST2' that are included in the memory strings CS11 and CS21 in the memory block based on the erase count value ECN.

Figure 5:
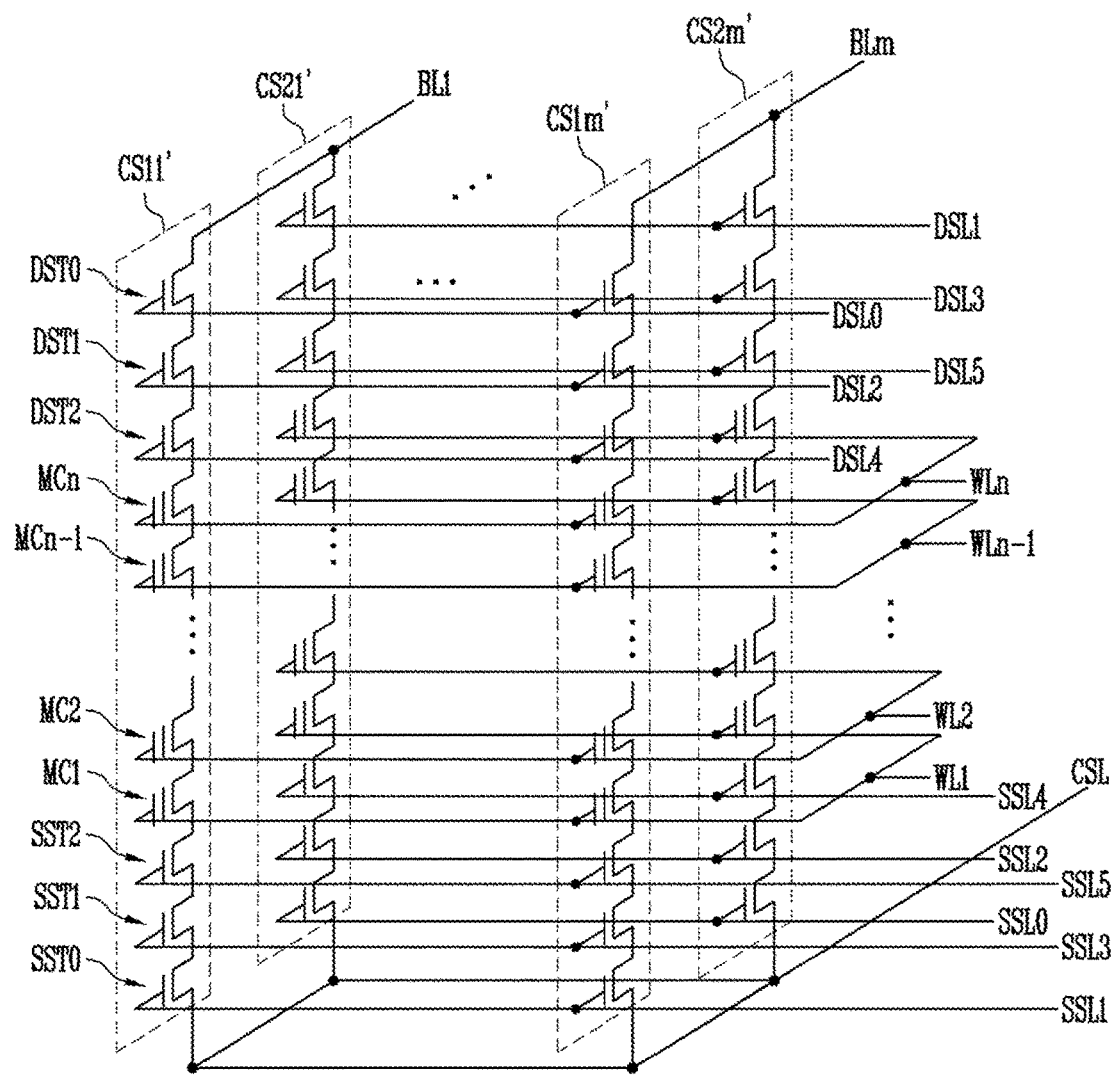
FIG. 5 is a circuit diagram illustrating an embodiment of one of the memory blocks BLK1 through BLKz of FIG. 2.

FIG. 5 is a circuit diagram illustrating other embodiments of one of the memory blocks BLK1' through BLKz' of FIG. 2.

Referring to FIG. 5, a memory block BLK1' includes a plurality of cell strings CS11' through CS1m' and CS21' through CS2m'. Each of the plurality of cell strings CS11' through CS1m' and CS21' through CS2m' extends in the +Z direction. Each of the plurality of cell strings CS11' through CS1m' and CS21' through CS2m' includes the plurality of source select transistors SST0 through SST2, the first through nth memory cells MC1 through MCn, and the plurality of drain select transistors DST0 through DST2 that are stacked in the +Z direction.

The source select transistor SST0 arranged in the outermost part among the plurality of source select transistors SST0 through SST2 of each cell string is connected to the common source line CSL and the remaining source select transistors SST1 and SST2 are connected between the source select transistor SST0 and the first memory cell MC1. The plurality of source select transistors SST0 through SST2 are respectively connected to a plurality of source select lines SSL1, SSL3, and SSL5.

A gate of the first memory cell MC1 of each cell string is connected to the first word line WL1. A gate of a second memory cell MC2 of each cell string is connected to the second word line WL2. A gate of the nth memory cell MCn of each cell string is connected to the nth word line WLn. Unlike in the embodiment of FIG. 3, the cell string illustrated in FIG. 5 does not include a pipe transistor. As a result, excluding that the pipe transistor PT is excluded from each cell string, the memory block BLK1' of FIG. 5 has an equivalent circuit similar to the memory block BLK1 of FIG. 3.

As described above, according to an embodiment of FIG. 5, it is illustrated that the three source select transistors SST0 through SST2 and the three drain select transistors DST0 through DST2 are arranged. However, the semiconductor memory device according to the present disclosure is not limited thereto. At least two source select transistors and at least two drain select transistors, that is, one outermost drain select transistor DST0 and at least one remaining drain select transistor DST1 and DST2 having one outermost source select transistor SST0 adjacent to the common source line CSL and at least one remaining source select transistor SST1 and SST2 and adjacent to a bit line may be arranged. That is, more than or equal to two source select transistors and more than or equal to two drain select transistors may be included in one cell string. In the semiconductor memory device 100 according to an embodiment of the present disclosure, during the erase operation performed on the memory block, the control logic 140 receives the erase count value ECN of the memory block to be erased from the erase count storage unit 160. The control logic 140 may determine transistors to which the erase operation voltage is to be applied in the pre-erase operation among the plurality of source select transistors SST0, SST1, and SST2 and the plurality of drain select transistors DST0, DST1, and DST2 that are included in the memory strings CS11 and CS21 in the memory block based on the erase count value ECN.

Figure 6:
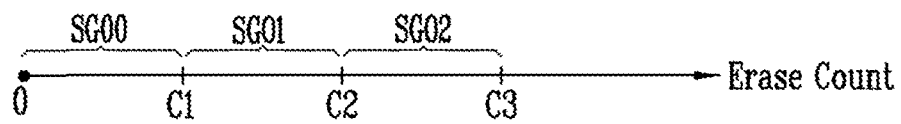
FIG. 6 is a view illustrating a method of selectively using select transistors in accordance with an erase count value according to an embodiment of the present disclosure.

FIG. 6 is a view illustrating a method of selectively using select transistors in accordance with an erase count value according to an embodiment of the present disclosure. Hereinafter, a method of determining transistors to which the erase operation voltage is to be applied in accordance with the erase count value ECN will be described with reference to FIGS. 4 and 6.

Referring to FIG. 6, three ranges in accordance with the erase count value ECN and select transistors selected in the corresponding ranges are illustrated, for example. In FIG. 6, in a range from 0 to C1, a first select transistor group SG00 is selected. In a range from C1 to C2, a second select transistor group SG01 is selected. In a range from C2 to C3, a third select transistor group SG02 is selected.

The range from 0 to C1 means that the number of times a corresponding memory block is erased is greater than or equal to 0; and less than C1. The control logic 140 compares the erase count value ECN received from the erase count storage unit 160 with threshold values C1, C2, and C3. When the erase count value ECN having the number of program-erase cycles of the corresponding memory block is less than the first threshold value C1, an erase count of the corresponding memory block is in the range from 0 to C1. In this case, the control logic 140 selects the source select transistors SST0 and SST0' that belong to the first select transistor group SG00 among the plurality of source select transistors SST0, SST1, SST2, SST0', SST1', and SST2'. On the other hand, the control logic 140 selects the drain select transistors DST0 and DST0' that belong to the first select transistor group SG00 among the plurality of drain select transistors DST0, DST1, DST2, DST0', DST1', and DST2'. According to the example illustrated in FIG. 4, the source select transistors SST0 and SST0' to which the erase operation voltage is to be applied in the range from 0 to C1 are closest to the common source line and the drain select transistors DST0 and DST0' to which the erase operation voltage is to be applied in the range from 0 to C1 are closest to the bit line.

In the pre-erase period, the erase operation voltage is applied to the selected source select transistors SST0 and SST0' and drain select transistors DST0 and DST0'. On the other hand, in the pre-erase period, the source select transistors SST1, SST2, SST1', and SST2' and the drain select transistors DST1, DST2, DST1', and DST2' that are not selected may be floated.

When the erase count value ECN that means the number of program-erase cycles of the corresponding memory block is greater than or equal to the first threshold value C1; and less than the second threshold value C2, an erase count of the corresponding memory block is in the range from C1 to C2. In this case, the control logic 140 selects the source select transistors SST1 and SST1' that belong to the second select transistor group SG01 among the plurality of source select transistors SST0, SST1, SST2, SST0', SST1', and SST2'. On the other hand, the control logic 140 selects the drain select transistors DST1 and DST1' that belong to the second select transistor group SG01 among the plurality of drain select transistors DST0, DST1, DST2, DST0', DST1', and DST2'. In the pre-erase period, the erase operation voltage is applied to the selected source select transistors SST1 and SST1' and drain select transistors DST1 and DST1'. On the other hand, in the pre-erase period, the source select transistors SST0, SST2, SST0', and SST2' and the drains elect transistors DST0, DST2, DST0', and DST2' that are not selected may be floated.

When the erase count value ECN having the number of program-erase cycles of the corresponding memory block is greater than or equal to the second threshold value C2 and less than the third threshold value C3, an erase count of the corresponding memory block is in the range from C2 to C3. In this case, the control logic 140 selects the source select transistors SST2 and SST2' that belong to the third select transistor group SG02 among the plurality of source select transistors SST0, SST1, SST2, SST0', SST1', and SST2'. On the other hand, the control logic 140 selects the drain select transistors DST2 and DST2' that belong to the third select transistor group SG02 among the plurality of drain select transistors DST0, DST1, DST2, DST0', DST1', and DST2'. In the pre-erase period, the erase operation voltage is applied to the selected source select transistors SST2 and SST2' and drain select transistors DST2 and DST2'. On the other hand, in the pre-erase period, the source select transistors SST0, SST1, SST0', and SST1' and the drains elect transistors DST0, DST1, DST0', and DST1' that are not selected may be floated. In FIG. 6, it is illustrated that the range in which the third select transistor group SG02 is used is specified by the specific third threshold value C3. However, according to an embodiment, the third threshold value C3 may have an infinite value. That is, when the erase count value ECN is greater than or equal to the second threshold value C2, the third select transistor group SG02 may be used.

The first through third threshold values C1, C2, and C3 are predetermined values and may be related to a life of the semiconductor memory device.

On the other hand, in FIG. 6, it is illustrated that the first select transistor group SG00, the second select transistor group SG01, and the third select transistor group SG02 are respectively used in the first range from 0 to C1, the second range from C1 to C2, and the third range from C2 to C3. However, the operation of the semiconductor memory device 100 according to an embodiment of the present disclosure is not limited thereto.

For example, in the first range from 0 to C1, the second select transistor group SG01 or the third select transistor group SG02 may be used. In addition, in the second range from C1 to C2, the first select transistor group SG00 or the third select transistor group SG02 may be used. On the other hand, in the third range from C2 to c3, the first select transistor group SG00 or the second select transistor group SG01 may be used.

Referring to FIG. 6, it is illustrated that the erase operation voltage is applied to only one select transistor group during the erase operation of the semiconductor memory device. However, as occasion demands, the erase operation voltage may be applied to the plurality of select transistor groups. For example, in the first range from 0 to C1, the first select transistor group SG00 and the second select transistor group SG01 may be simultaneously used. As another example, in the first range from 0 to C1, the second select transistor group SG01 and the third select transistor group SG02 may be simultaneously used. That is, the number of select transistor groups to be used in each range may vary as occasion demands.

Referring to FIG. 4, it is illustrated that the drain select transistors DST0 and DST0' and the source select transistors SST0 and SST0' are included in the first select transistor group SG00, the drain select transistors DST1 and DST1' and the source select transistors SST1 and SST1' are included in the second select transistor group SG01, and the drain select transistors DST2 and DST2' and the source select transistors SST2 and SST2' are included in the third select transistor group SG02. However, as occasion demands, various combinations of select transistor groups may be defined.

For example, it may be determined that the drain select transistors DST1 and DST0' and the source select transistors SST2 and SST1' are included in the first select transistor group SG00, the drain select transistors DST2 and DST1' and the source select transistors SST0 and SST2' are included in the second select transistor group SG01, and the drain select transistors DST0 and DST2' and the source select transistors SST1 and SST0' are included in the third select transistor group SG02.

In general, regardless of the number of program-erase cycles, in the pre-erase period, the erase operation voltage is applied to the transistors DST0, DST0', SST0, and SST0' that belong to the first select transistor group SG00 for generating a gate induced drain leakage (GIDL) current. Therefore, as the number of program-erase cycles increases, in the pre-erase period, the transistors DST0, DST0', SST0, and SST0' to which the erase operation voltage is applied deteriorate. Therefore, reliability of the semiconductor memory device deteriorates as the erase operation is repeated.

In the above, the method of driving the cell string structure including the pipe transistor PT illustrated in FIGS. 3 and 4 was described. However, according to the embodiments, it is apparent to those skilled in the art that the above-described driving method may be also applied to the cell string structure that does not include the pipe transistor PT as illustrated in FIG. 5.

The semiconductor memory device 100 according to an embodiment of the present disclosure selects different select transistors in accordance with the number of program-erase cycles of the memory block and applies the erase operation voltage to the select transistors selected in the pre-erase period so that the GIDL current is generated. Therefore, the plurality of select transistors are selectively used in accordance with the number of program-erase cycles so that deterioration of the select transistors to which the erase-operation voltage is applied for generating the GIDL current is dispersed. Therefore, it may be possible to prevent the reliability of the semiconductor memory device from deteriorating as the erase operation is repeated.

Figure 7:
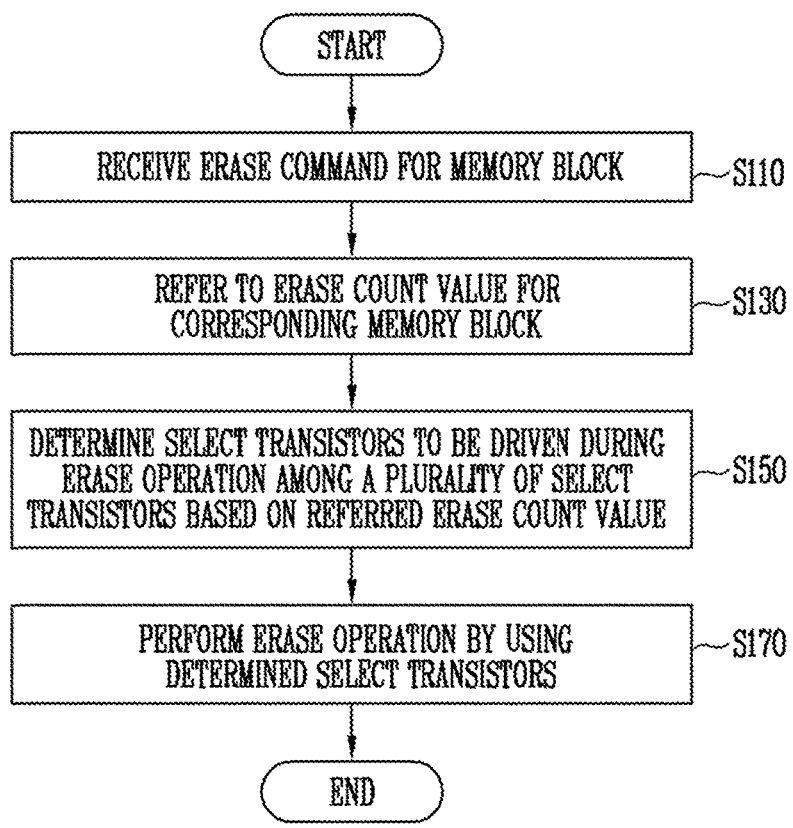
FIG. 7 is a flowchart illustrating an operating method according to an embodiment of the present disclosure.

FIG. 7 is a flowchart illustrating an operating method according to an embodiment of the present disclosure.

Referring to FIG. 7, in operation S110, an erase command for a memory block is received. The erase command may be received from a controller outside the semiconductor memory device. The memory block to be erased may include a plurality of cell strings. Referring to FIGS. 3 through 5, each of the plurality of cell strings may include a plurality of drain select transistors and a plurality of source select transistors.

In operation S130, the erase count value ECN for the memory block to be erased is referred to. The operation S130 may be performed by the control logic 140 illustrated in FIG. 1. That is, in the operation S130, the control logic 140 receives the erase count value ECN stored in the erase count storage unit 160.

In operation S150, select transistors to be driven during the erase operation are determined among the plurality of select transistors included in each of the cell strings in the memory block to be erased based on the referred erase count value ECN. The select transistors include the drain select transistors and the source select transistors. That is, in the operation S150, it is determined to which range the referred erase count value ECN belongs among the ranges illustrated, for example, in FIG. 6, based on which the source select transistors and the drain select transistors to which the erase operation voltage is to be applied in the pre-erase period are determined. In the example of FIG. 6, when the referred erase count value ECN belongs to the range from 0 to C1, in the operation S150, the select transistors DST0, DST0', SST0, and SST0' are selected. When the referred erase count value ECN belongs to the range from C1 to C2, in the operation S150, the select transistors DST2, DST2', SST2, and SST2' are selected.

In operation S170, the memory block to be erased is erased by using the determined select transistors. The erase operation performed in the operation S170 will be described with reference to FIGS. 8 to 10.

Figure 8:
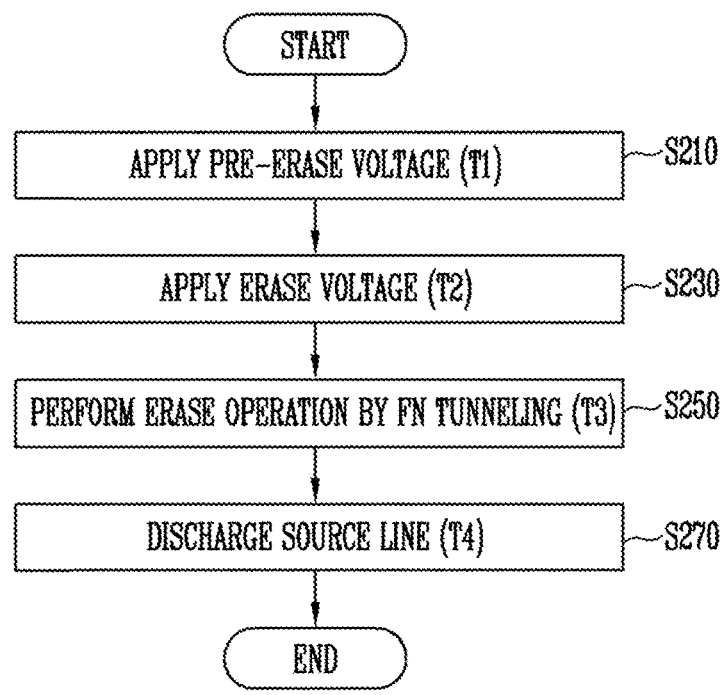
FIG. 8 is a flowchart illustrating, for example, processes of performing the erase operation of FIG. 7.

FIG. 8 is a flowchart illustrating processes of performing the erase operation of FIG. 7.

Figure 9:
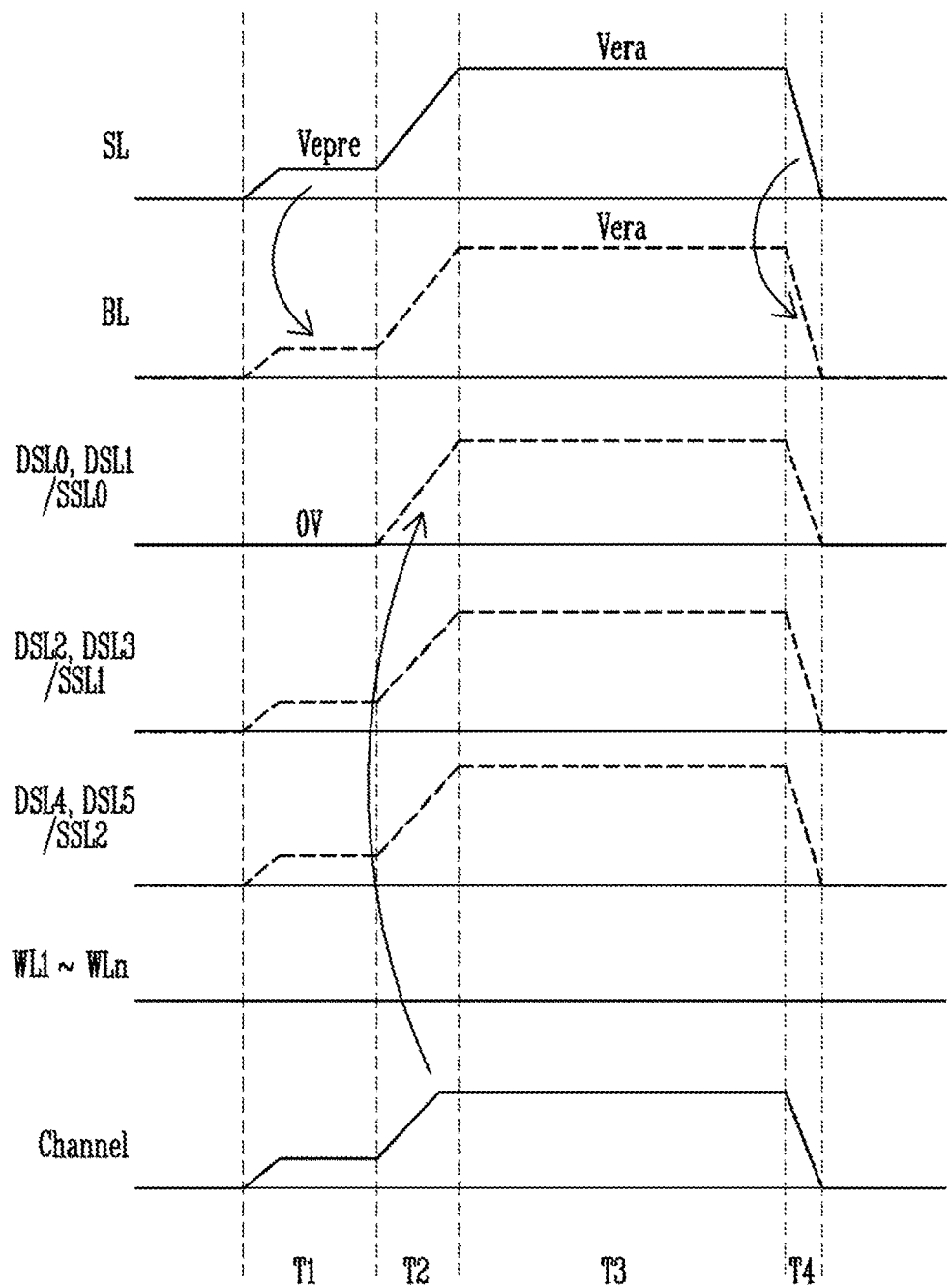
FIG. 9 is a waveform diagram of signals for describing the erase operation of FIG. 8.

FIG. 9 is a waveform diagram of signals for describing the erase operation of FIG. 8.

Figure 10:
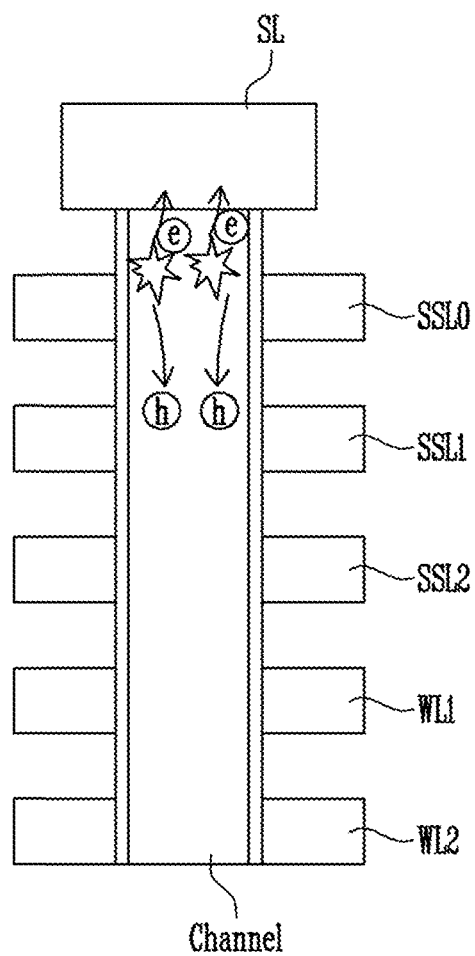
FIG. 10 is a cross-sectional view of a channel for describing generation of a gate induced drain leakage (GIDL) current during an erase operation according to the present disclosure.

FIG. 10 is a cross-sectional view of a channel for describing generation of a gate induced drain leakage (GIDL) current during an erase operation according to the present disclosure.

The erase operation of the semiconductor memory device according to the present disclosure, which is performed in the operation S170 illustrated in FIG. 7, will be described as follows. Hereinafter, the erase operation performed on the memory cell array structure illustrated in FIGS. 3 and 4 will be described. However, as described above, the erase operation according to the present disclosure is not limited thereto and may be also applied to the memory cell array structure illustrated in FIG. 5.

The present disclosure may be applied to any structure in which at least two drains select transistors and at least two source select transistors are formed. However, hereinafter, for convenience sake, a structure in which three drains select transistors and three source select transistors are formed is taken as an example. On the other hand, hereinafter, the case in which the erase count value ECN referred to in the operation S130 belongs to the range from 0 to C1 will be described. Since the erase count value ECN referred to in the operation S130 belongs to the range from 0 to C1, in the operation S150, the select transistors DST0, DST0', SST0, and SST0' are determined as the select transistors to be driven during the erase operation.

First, in a period T1, the pre-erase voltage Vepre is applied S210. The period T1 may be referred to as "the pre-erase period". The voltage generator 150 generates the pre-erase voltage Vepre in accordance with the control of the control logic 140 and the address decoder 120 applies the pre-erase voltage Vepre generated by the voltage generator 150 in accordance with the control of the control logic 140 to the common source line CSL of the memory cell array 110. At this time, a potential level of the bit line (for example, BL1) adjacent to the common source line CSL increases due to a coupling phenomenon caused by the pre-erase voltage Vepre applied to the common source line CSL.

In operation S210, the erase operation voltage is applied to the select transistors DST0, DST0', SST0, and SST0' determined in the operation S150. For example, the erase operation voltage may be 0V. Therefore, the erase operation voltage of 0V is applied to the drain select transistors DST0 and DST0' and the source select transistors SST0 and SST0' so that the corresponding select transistors DST0, DST0', SST0, and SST0' are turned off. In the drain select transistors DST0 and DST0' and the source select transistors SST0 and SST0' that are in turn-off states, as illustrated in FIG. 10, when the potential levels of the common source line CSL and the bit line BL1 increase, electric fields of gates and drains increase. Therefore, due to holes of electron hole pairs (EHP) generated in drain regions, leakage current flows between the drains and bulk ends so that the GIDL current flows in a direction of a channel Channel. That is, in the drain regions of the drain select transistors DST0 and DST0' and the source select transistors SST0 and SST0', hot holes (h) are generated and are received in the direction of the channel Channel so that a potential level of the channel Channel increases.

At this time, the drain select transistors DST1, DST1', DST2, and DST2' and the source select transistors SST1, SST1', SST2, and SST2' that are not selected in the operation S150 are controlled to be floated. Although the drain select transistors DST1, DST1', DST2, and DST2' and the source select transistors SST1, SST1', SST2, and SST2' are floated, the hot holes (h) received to the lower channel of the drain select transistors DST1, DST1', DST2, and DST2' and the source select transistors SST1, SST1', SST2, and SST2' are charge shared and received to a lower channel of memory cells MC1, MC1', MCn, and MCn' due to a potential difference caused by the operation voltage of 0V applied to the first word line WL1 and the nth word line WLn.

Therefore, while the pre-erase voltage Vepre is applied to the common source line CSL, the erase operation voltage of 0V is applied to the drain select transistors DST0 and DST0' and the source select transistors SST0 and SST0' so that the GIDL current is generated and the drain select transistors DST1, DST1', DST2, and DST2' and the source select transistors SST1, SST1', SST2, and SST2' are controlled to be floated. Therefore, leakage current characteristics of the source select transistors SST1, SST1', SST2, and SST2' and the drain select transistors DST1, DST1', DST2, and DST2' do not deteriorate.

The above-described content and the waveform diagram of FIG. 9 illustrate that the erase count value ECN is in the range from 0 to C1 so that the erase operation voltage is determined to be applied to the drain select transistors DST1, DST1', DST2, and DST2' and the source select transistors SST1, SST1', SST2, and SST2'. When the program-erase operation is repeated so that the erase count value ECN is in the range from C1 to C2 later, while the pre-erase voltage Vepre is applied to the common source line CSL, the erase operation voltage of 0V is applied to the drain select transistors DST1 and DST1' and the source select transistors SST1 and SST1' so that the GIDL current is generated and the drain select transistors DST0, DST0', DST2, and DST2' and the source select transistors SST0, SST0', SST2, and SST2' are controlled to be floated. Therefore, in the corresponding range from C1 to C2, leakage current characteristics of the source select transistors SST0, SST0', SST2, and SST2' and the drain select transistors DST0, DST0', DST2, and DST2' do not deteriorate.

In addition, when the program-erase operation is continuously repeated so that the erase count value ECN is in the range from C2 to C3 later, while the pre-erase voltage Vepre is applied to the common source line CSL, the erase operation voltage of 0V is applied to the drain select transistors DST2 and DST2' and the source select transistors SST2 and SST2' so that the GIDL current is generated and the drain select transistors DST0, DST0', DST1, and DST1' and the source select transistors SST0, SST0', SST1, and SST1' are controlled to be floated. Therefore, in the corresponding range from C2 to C3, leakage current characteristics of the source select transistors SST0, SST0', SST1, and SST1' and the drain select transistors DST0, DST0', DST1, and DST1' do not deteriorate.

As described above, in the semiconductor memory device according to an embodiment of the present disclosure and the method of operating the same, parts of the plurality of drain select transistors and the plurality of source select transistors are selectively driven based on the erase count value ECN so that the GIDL current is generated. Therefore, the deteriorations of the leakage current characteristics are dispersed into the plurality of drain select transistors and the plurality of source select transistors so that it is possible to reduce deterioration of the semiconductor memory device caused by the repetition of the program-erase operation and to improve the operation reliability of the semiconductor memory device.

Then, in a period T2, the erase voltage Vera is applied in operation S230. The voltage generator 150 increases a potential level of the pre-erase voltage Vepre in accordance with the control of the control logic 140 and generates the erase voltage Vera and the address decoder 120 applies the erase voltage Vera generated by the voltage generator 150 in accordance with the control of the control logic 140 to the common source line CSL of the memory cell array 110. At this time, the potential level of the bit line (for example, BL1) adjacent to the common source line CSL increases due to the coupling phenomenon caused by the erase voltage Vera applied to the common source line CSL.

At this time, the drain select transistors DST1, DST1', DST2, and DST2' and the source select transistors SST1, SST1', SST2, and SST2' to which the erase operation voltage of 0V is applied are controlled to be floated.

The potential level of the channel Channel increases in accordance with the potential levels of the common source line CSL and the bit line BL1. In addition, potential levels of the source select lines SSL0 through SSL2 and SSL0' through SSL2' and the drain select lines DSL0 through DSL5 that are connected to the plurality of floated source select transistors SST0 through SST2 and SST0' through SST2' and floated drain select transistors DST0 through DST2 and the DST0' through DST2' increase in accordance with the potential level of the channel Channel due to the coupling phenomenon.

Then, in a period T3, the erase operation is performed by Fowler-Nordheim (FN) tunneling in operation S250. Data stored in the memory cells MC1 through MCn and MC1' through MCn' is erased by the increased potential level of the channel Channel. That is, electrons stored in charge storage layers of the memory cells MC1 through MCn and MC1' through MCn' are detrapped by the potential level of the channel Channel due to the FN tunneling phenomenon, which will be described as follows. In accordance with a difference between the increased potential level of the channel Channel and potential levels that are ground levels of the word lines WL1 through WLn, the electrons stored in the charge storage layers of the memory cells MC1 through MCn and MC1' through MCn' leak to the channel Channel and are detrapped or the hot holes generated in the channel Channel are received to the charge storage layers of the memory cells MC1 through MCn and MC1' through MCn' so that the electrons stored in the charge storage layers are detrapped. At this time, the word lines WL1 through WLn may maintain the ground levels; or the potential levels of the word lines WL1 through WLn may change from floating state to the ground levels.

Then, in a period T4, the common source line CSL is discharged in operation S270. After the data of the first through nth memory cells MC1 through MCn is erased by the erase operation in the operation S250, the erase voltage Vera applied to the common source line CSL is blocked and the potential of the common source line CSL is discharged.

As described above, the case in which the erase count value ECN belongs to the range from 0 to C1 is described with reference to FIGS. 8 and 9.

When the erase count value ECN belongs to the range from C1 to C2, in the operation S150, the drain select transistors DST1 and DST1' and the source select transistors SST1 and SST1' are selected. Therefore, in the period T1, the drain select lines DSL0 and DSL1 and the source select line SSL0 are floated and the erase operation voltage of 0V is applied to the drain select lines DSL2 and DSL3 and the source select line SSL1. The other operations are the same as illustrated in FIG. 9.

When the erase count value ECN belongs to the range from C2 to C3, in the operation S150, the drain select transistors DST2 and DST2' and the source select transistors SST2 and SST2' are selected. Therefore, in the period T1, the drain select lines DSL0 and DSL1 and the source select line SSL0 are floated and the erase operation voltage of 0V is applied to the drain select lines DSL4 and DSL5 and the source select line SSL2. The other operations are the same as illustrated in FIG. 9.

In the timing diagram of FIG. 9, it is illustrated that only one select transistor group is selected. That is, it is illustrated that the erase count value ECN belongs to the range from 0 to C1 and the first erase operation voltage is determined to be applied to the first select transistor group SG00 including the drain select transistors DST1, DST1', DST2, and DST2' and the source select transistors SST1, SST1', SST2, and SST2'. However, FIG. 9 is an example only. As described above, at least two select transistor groups are determined so that the erase operation voltage may be applied in the pre-erase period. For example, as occasion demands, the first erase operation voltage may be determined to be applied to the first select transistor group SG00 and the second select transistor group SG01. In this case, in the period T1, the erase operation voltage may be applied to the select transistors DST0, DST0', DST1, DST1', SST0, SST0', SST1, and SST1'. As described above, the erase operation voltage may be determined to be applied to at least two select transistor groups in the pre-erase period.

Figure 11:
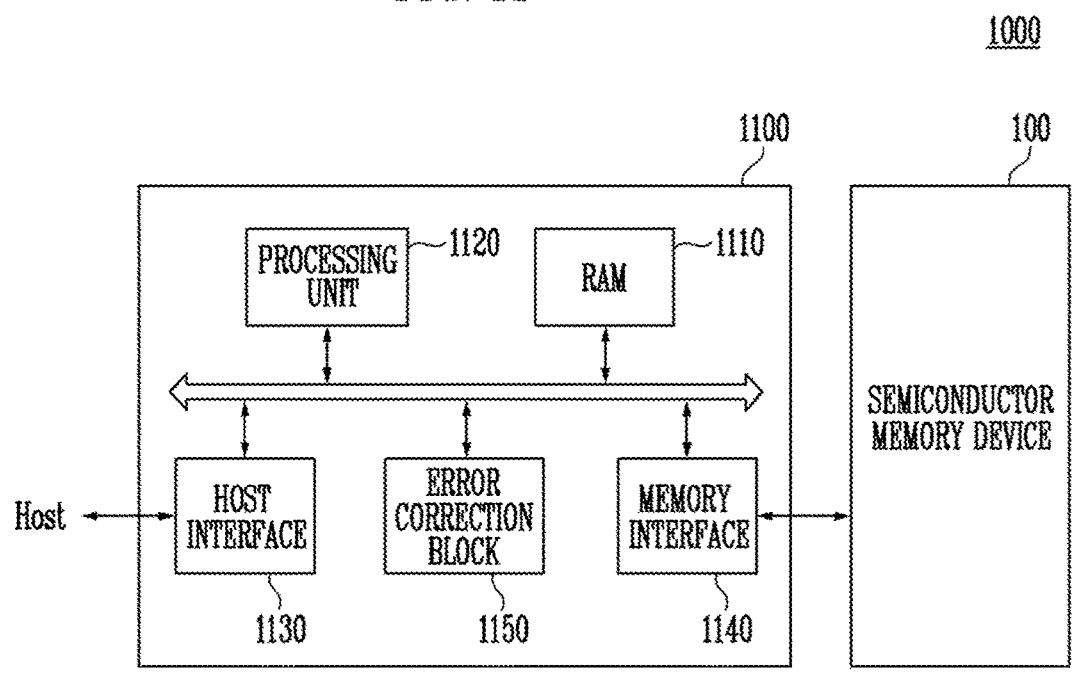
FIG. 11 is a block diagram illustrating a memory system including the semiconductor memory device of FIG. 1.

FIG. 11 is a block diagram illustrating a memory system 1000 including the semiconductor memory devices of FIG. 1.

Referring to FIG. 11, the memory system 1000 includes the semiconductor memory device 100 and a controller 1100. The semiconductor memory device 100 may be the semiconductor memory devices illustrated with reference to FIG. 1. Hereinafter, repeated description will not be given.

The controller 1100 is connected to a host Host and the semiconductor memory device 100. In response to request from the host Host, the controller 1100 is configured to access the semiconductor memory device 100. For example, the controller 1100 is configured to control read, write, erase, and background operation of the semiconductor memory device 100. The controller 1100 is configured to provide interface between the semiconductor memory device 100 and the host Host. The controller 1100 is configured to drive firmware for controlling the semiconductor memory device 100.

The controller 1100 includes a random access memory (RAM) 1110, a processing unit 1120, a host interface 1130, a memory interface 1140, and an error correction block 1150. The RAM 1110 is used as at least one among an operation memory of the processing unit 1120, a cache memory between the semiconductor memory device 100 and the host Host, and a buffer memory between the semiconductor memory device 100 and the host Host. The processing unit 1120 controls an overall operation of the controller 1100. In addition, the controller 1100 may temporarily store program data provided from the host Host during the write operation.

The host interface 1130 includes protocols for exchanging data between the host Host and the controller 1100. As an example of an embodiment, the controller 1100 is configured to communicate with the host Host through at least one among various interface protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, enhanced small disk interface (ESDI) protocol, an integrated drive electronics (IDE) protocol, and a private protocol.

The memory interface 1140 interfaces with the semiconductor memory device 100. For example, the memory interface 1140 includes a NAND interface or a NOR interface.

The error correcting block 1150 is configured to detect errors of the data received from the semiconductor memory device 100 by using an error correcting code (ECC) and to correct the detected errors. The processing unit 1120 controls the semiconductor memory device 100 to control the read voltage in accordance with the error detection result of the error correcting block 1150 and to perform re-reading. As an example of an embodiment, the error correcting block 1150 may be provided as an element of the controller 1100.

The controller 1100 and the semiconductor memory device 100 may be integrated as one semiconductor device. As an example of an embodiment, the controller 1100 and the semiconductor memory device 100 may be integrated as one semiconductor device and may form a memory card. For example, the controller 1100 and the semiconductor memory device 100 may be integrated as one semiconductor device and may form the memory card such as a personal computer memory card international association (PCMCIA), a compact flash (CF) card, a smart media (SM) card (SMC), a memory stick, multimedia cards (MMC, RS-MMC, and MMCmicro), SD cards (SD, miniSD, microSD, and SDHC), or a universal flash storage (UFS) device.

The controller 1100 and the semiconductor memory device 100 may be integrated as one semiconductor device and may form a semiconductor drive such as a solid state drive (SSD). The semiconductor drive (SSD) includes a storage device configured to store data in a semiconductor memory. When the memory system 1000 is used as the semiconductor drive (SSD), an operation speed of the host Host connected to the memory system 1000 remarkably increases.

As an example, the memory system 1000 is provided as one of various elements of an electronic device such as one of various elements that form a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable gamer, a navigator, a black box, a digital camera, a three-dimensional television, a digital audio recorder, a digital audio player, a digital picture recorder, a digital picture player, a digital video recorder, a digital video player, a device capable of transmitting and receiving information in a wireless environment, one of various electronic devices that form a home network, one of various electronic devices that form a computer network, one of various electronic devices that form a telematics network, an RFID device, or a computing system.

As an example of an embodiment, the semiconductor memory device 100 or the memory system 1000 may be mounted as one of various types of package. For example, the semiconductor memory device 100 or the memory system 1000 may be packaged by a method such as a package on package (PoP), ball grid arrays (BGAs), chip scale packages (CSPs), a plastic leaded chip carrier (PLCC), a plastic dual in line package (PDIP), a die in waffle pack, a die in wafer form, a chip on board (COB), a ceramic dual in line package (CERDIP), a plastic metric quad flat pack (MQFP), a thin quad flatpack (TQFP), a small outline (SOIC), a shrink small outline package (SSOP), a thin small outline (TSOP), a thin quad flatpack (TQFP), a system in package (SIP), a multichip package (MCP), a wafer-level fabricated package (WFP), or a wafer-level processed stack package (WSP) and may be mounted.

Figure 12:
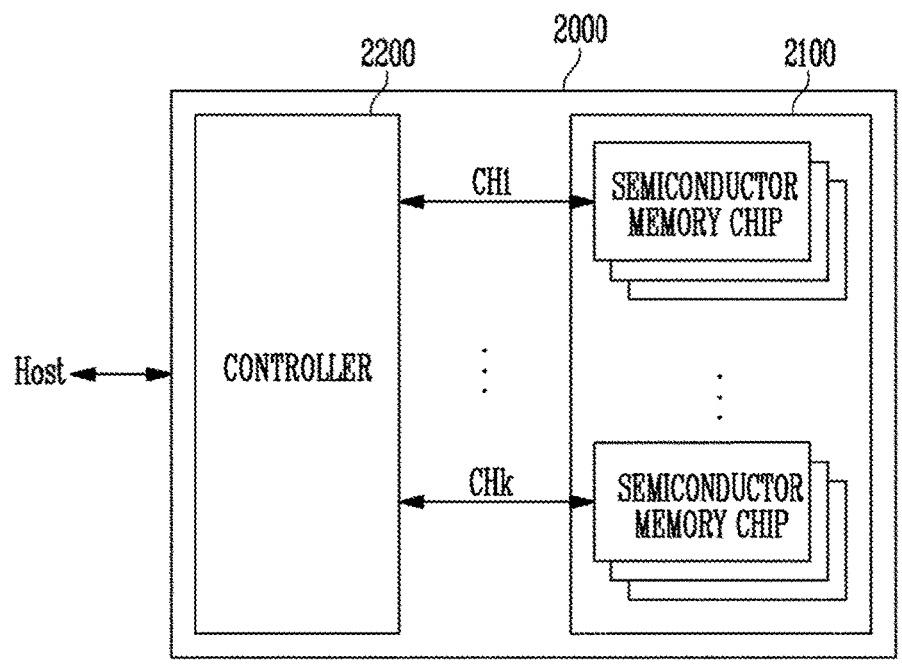
FIG. 12 is a block diagram illustrating an application example of the memory system of FIG. 11.

FIG. 12 is a block diagram illustrating an application example of the memory system of FIG. 11.

Referring to FIG. 12, a memory system 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 12, it is illustrated that the plurality of groups communicate with the controller 2200 through first through kth channels CH1 through CHk. Each semiconductor memory chip is configured and operates like the semiconductor memory devices 100 described with reference to FIG. 1.

Each group is configured to communicate with the controller 2200 through a common channel. The controller 2200 is configured like the controller 1100 described with reference to FIG. 11 and is configured to control the plurality of memory chips of the semiconductor memory device 2100 through the plurality of channels CH1 through CHk.

Figure 13:
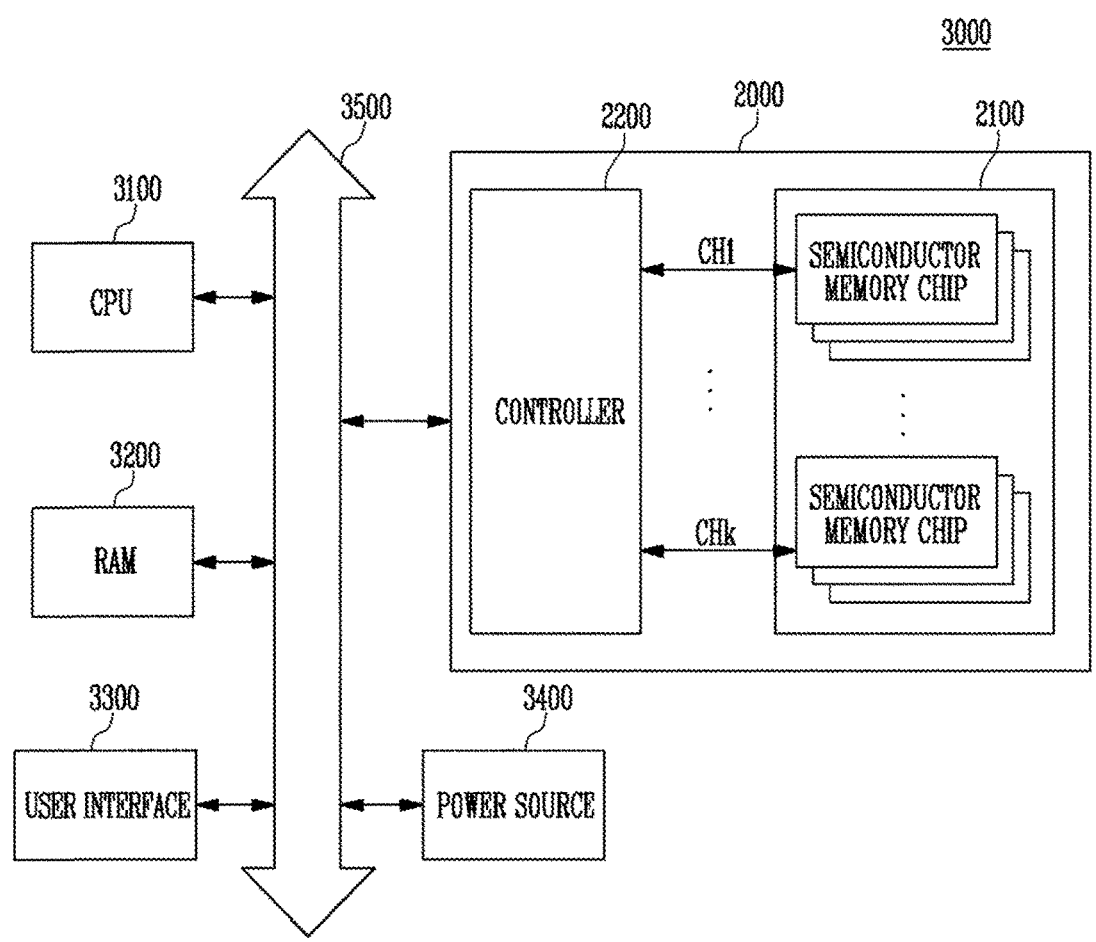
FIG. 13 is a block diagram illustrating a computing system including the memory system of FIG. 12.

FIG. 13 is a block diagram illustrating a computing system including the memory system of FIG. 12.

A computing system 3000 includes a central processing unit (CPU) 3100, a random access memory (RAM) 3200, a user interface 3300, a power source 3400, a system bus 3500, and the memory system 2000.

The memory system 2000 is electrically connected to the CPU 3100, the RAM 3200, the user interface 3300, and the power source 3400 through the system bus 3500. The data provided through the user interface 3300 or processed by the CPU 3100 is stored in the memory system 2000.

In FIG. 13, the semiconductor memory device 2100 is illustrated as being connected to the system bus 3500 through the controller 2200. However, the semiconductor memory device 2100 may be configured to be directly connected to the system bus 3500. At this time, a function of the controller 2200 is performed by the CPU 3100 and the RAM 3200.

In FIG. 13, it is illustrated that the memory system 2000 described with reference to FIG. 12 is provided. However, the memory system 2000 may be replaced by the memory system 1000 described with reference to FIG. 11. As an example of an embodiment, the computing system 3000 may be configured to be included in each of the memory systems 1000 and 2000 described with reference to FIGS. 11 and 12.

Examples of embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A semiconductor memory device comprising:
   a memory cell array including a plurality of memory blocks each including a plurality of cell strings, each of the plurality of cell strings including at least two select transistors;
   an erase count storage unit configured to store an erase count value for each of the plurality of memory blocks; and
   a control logic configured to control the semiconductor memory device to perform an erase operation on a memory block based on the erase count value of the memory block to be erased,
   wherein the erase count value indicates a number of times the erase operation is performed for the memory block,
   wherein the control logic determines, based on the erase count value, a first select transistor among the select transistors to which an erase operation voltage is to be applied during the erase operation, and
   wherein the control logic determines, based on the erase count value, a second select transistor among the select transistors to be floated when the erase operation voltage is to be applied to the first select transistor.

2. The semiconductor memory device of claim 1, wherein each of the plurality of cell strings further comprises a plurality of memory cells,
   wherein the select transistors include a plurality of source select transistors and a plurality of drain select transistors, and
   wherein the plurality of source select transistors, the plurality of memory cells and the plurality of drain select transistors are coupled between a source line and a bit line.

3. The semiconductor memory device of claim 2, wherein the control logic determines the first select transistor to which an erase operation voltage is to be applied among the plurality of source select transistors and the plurality of drain select transistors, based on the erase count value.

4. The semiconductor memory device of claim 3, wherein, when the erase count value is less than a predetermined first threshold value, a first source select transistor among the plurality of source select transistors and a first drain select transistor among the plurality of drain select transistors are determined as transistors to which the erase operation voltage is to be applied.

5. The semiconductor memory device of claim 4, wherein the first source select transistor is closest to the source line among the plurality of source select transistors.

6. The semiconductor memory device of claim 5, wherein the first drain select transistor is closest to the bit line among the plurality of drain select transistors.

7. The semiconductor memory device of claim 6, wherein, when the erase count value is greater than or equal to the first threshold value and less than a predetermined second threshold value, a second source select transistor different from the first source select transistor among the plurality of source select transistors and a second drain select transistor different from the first drain select transistor among the plurality of drain select transistors are determined as transistors to which the erase operation voltage is to be applied.

8. The semiconductor memory device of claim 7,
wherein, while a pre-erase voltage is applied to the source line during an erase operation, the erase operation voltage is applied to the transistors determined as transistors to which the erase operation voltage is to be applied, and
wherein the erase operation voltage has a ground level.

9. The semiconductor memory device of claim 8, wherein, while a pre-erase voltage is applied to the source line during an erase operation, transistors, that are not transistors to which the erase operation voltage is to be applied, are floated.

10. The semiconductor memory device of claim 9, wherein, while an erase voltage is applied to the source line during an erase operation, the plurality of source select transistors and the plurality of drain select transistors are floated.

11. The semiconductor memory device of claim 10, further comprising:
an address decoder coupled to the memory cell array through row lines and configured to decode an address for operating the memory cell array;
a voltage generator configured to generate operation voltages and to supply the generated operation voltages to the row lines coupled to the address decoder; and
a read and write circuit connected to the bit line to perform a read operation and a program operation on the memory cell array,
wherein the voltage generator generates the pre-erase voltage and the erase voltage, and
wherein, during an erase operation, the read and write circuit floats the bit line.

12. A semiconductor memory device comprising:
a memory cell array including a cell string including a plurality of source select transistors, a plurality of memory cells, and a plurality of drain select transistors that are coupled between a source line and a bit line; and
a peripheral circuit unit configured to apply an erase pre-voltage and an erase voltage to the cell string during an erase operation and to erase data stored in the plurality of memory cells included in the cell string,
wherein the peripheral circuit unit determines at least one select transistor to which an erase operation voltage is to be applied based on an erase count value, among the plurality of source select transistors and the plurality of drain select transistors, the erase count value including the number of times an erase operation is performed on the cell string, and
wherein, while a pre-erase voltage is applied to a source line of the cell string, the erase operation voltage is applied to the determined at least one select transistor, and the plurality of source select transistor and the plurality of drain select transistor are floated except for the determined at least one select transistor.

13. The semiconductor memory device of claim 12, wherein, while a pre-erase voltage is applied to a source line of the cell string, the other select transistors excluding the determined at least one select transistor are floated.

14. The semiconductor memory device of claim 12, wherein the at least one select transistor to which the erase operation voltage is to be applied is a source select transistor.

15. The semiconductor memory device of claim 12, wherein the at least one select transistor to which the erase operation voltage is to be applied is a drain select transistor.

16. The semiconductor memory device of claim 13, wherein, while a pre-erase voltage is applied to a source line of the cell string, the erase operation voltage applied to the determined source select transistor and drain select transistor has a ground level.

17. A method of operating a semiconductor memory device, the method comprising:
receiving an erase command for a memory block including a cell string including a plurality of source select transistors, a plurality of memory cells, and a plurality of drain select transistors that are coupled between a source line and a bit line;
referring to an erase count value for the memory block on which the erase command is to be performed, the erase count value indicating the number of times an erase operation is performed for the memory block before receiving of the erase command;
determining first select transistors to be driven during an erase operation among the plurality of source select transistors and the plurality of drain select transistors of the cell string, based on the referred erase count value; and
performing an erase operation on the memory block corresponding to the erase command by using the first select transistors.

18. The method of claim 17, wherein, in the determining of the first select transistors to be driven during the erase operation, one among the plurality of source select transistors is determined to be driven based on a range to which the erase count value belongs.

19. The method of claim 17, wherein, in the determining of the first select transistors to be driven during the erase operation, one among the plurality of drain select transistors is determined to be driven based on a range to which the erase count value belongs.

20. The method of claim 17, wherein the performing of the erase operation on the memory block on which the erase command is to be performed by using the first select transistors comprises:
applying a pre-erase voltage to a source line connected to cell string in a selected memory block and receiving a gate induced drain leakage (GIDL) current to a channel of the cell string; and
applying an erase voltage to the source line and erasing data stored in memory cells included in the cell string,
wherein, while the pre-erase voltage is applied to the source line, an erase operation voltage of a ground level is applied to the first select transistors, and second select transistors except for the first select transistors are floated.

\* \* \* \* \*